United States Patent [19]

Vaes et al.

[11] Patent Number: 5,637,437
[45] Date of Patent: Jun. 10, 1997

[54] IMAGING ELEMENT AND METHOD FOR MAKING A LITHOGRAPHIC PRINTING PLATE ACCORDING TO THE SILVER SALT DIFFUSION TRANSFER PROCESS

[75] Inventors: Jos Vaes, Betekom; Luc Wabbes, Mortsel, both of Belgium

[73] Assignee: AGFA-Gevaert, N.V., Mortsel, Belgium

[21] Appl. No.: 642,312

[22] Filed: May 3, 1996

[30] Foreign Application Priority Data

May 8, 1995 [EP] European Pat. Off. ............. 95201162

[51] Int. Cl.$^6$ .................. G03C 8/06; G03F 7/07
[52] U.S. Cl. ............ 430/204; 430/229; 430/230
[58] Field of Search ................... 430/204, 230, 430/227, 229

[56] References Cited

U.S. PATENT DOCUMENTS

| | | | |
|---|---|---|---|
| 4,361,635 | 11/1982 | Kinderman et al. | 430/204 |
| 4,510,228 | 4/1985 | Tscbai et al. | 430/204 |
| 5,468,588 | 11/1995 | Macioch et al. | 430/204 |
| 5,552,258 | 9/1996 | Macioch | 430/204 |

*Primary Examiner*—Richard L. Schilling
*Attorney, Agent, or Firm*—Breiner & Breiner

[57] ABSTRACT

The present invention provides an imaging element comprising on a support in the order given (i) a base layer comprising a binder in an amount between 1 and 3 g/m$^2$, (it) a photosensitive layer comprising a spectrally sensitised silver halide emulsion, said emulsion consisting principally of silver chloride but containing bromide ranging from 0.1 mole % to 40 mole % and iodide ranging from 0 to 2 mole % and (iii) a receiving layer containing physical development nuclei in water permeable relationship with said photosensitive layer, characterized in that the ratio by weight of gelatin to silver halide (expressed as an equivalent amount of AgNO$_3$) in said photosensitive layer is at least 1.35.

5 Claims, No Drawings

IMAGING ELEMENT AND METHOD FOR MAKING A LITHOGRAPHIC PRINTING PLATE ACCORDING TO THE SILVER SALT DIFFUSION TRANSFER PROCESS

DESCRIPTION

1. Field of the invention

The present invention relates to an imaging element, for making improved lithographic printing plates according to the silver salt diffusion transfer process.

The present invention further relates to a method for making improved lithographic printing plates according to the silver salt diffusion transfer process.

2. Background of the invention.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image-receiving layer of a sheet or web material which is a separate element with respect to the photographic silver halide emulsion material (a so-called two-sheet DTR-element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

Commercial lithographic printing plate precursors of the latter type typically contain on a support in the order given a base layer serving as an anti-halation layer, a silver halide emulsion layer and a surface layer containing physical development nuclei in which the silver image is formed.

Such lithographic printing plate precursors, also called imaging elements may be camera exposed or they can be exposed by means of a scan exposure e.g. a laser or L.E.D. exposure. The latter offers the advantage that the preparation of the printing plate is simplified in that a paste-up to be used for the exposure of the imaging element can be completely prepared on a computer. This paste-up prepared on the computer is then transferred to an image setter equiped with e.g. laser that takes care of the exposure of the imaging element.

EP-A-633504 is concerned about the dependence of the lithographic prperties of printing plates containing meso-ionic compounds on the degree of exhaustion of the alkaline processing liquid. Said application discloses that the weight ratio of the amount of hydrophilic colloid to silver in the silver halide emulsion layer is preferably not more than 1.2.

EP-A-557616 is concerned about improving the contrast and the sharpness of an image without decreasing the speed of the silver halide emulsion. Said application discloses an imaging element comprising an antihalation layer and a layer containing a photosensitive silver halide eulsion containing 2 g $AgNO_3/m^2$ and 2.62 g gelatin/$m^2$;

It has been found that DTR-materials show pressure marks, i.e. the non-exposed areas of a DTR-material becomes partially developable when pressure is executed on said areas, resulting in a loss of silver in the silver receiving (printing) areas of the silver receiving layer and so in a lower printing endurance of the printing plate, what poses a serious problem.

SUMMARY OF INVENTION

It is an object of the present invention to provide an imaging element that can yield printing plates of improved quality, i.e. high printing endurance.

It is a further object of the present invention to provide a method for making a printing plate according to the silver salt diffusion transfer process.

Further objects of the present invention will become clear from the description hereinafter.

According to the present invention there is provided an imaging element comprising on a support in the order given (i) a base layer comprising a binder in an amount between 1 and 3 g/$m^2$, (ii) a photosensitive layer comprising a spectrally sensitised silver halide emulsion, said emulsion consisting principally of silver chloride but containing bromide ranging from 0.1 mole % to 40 mole % and iodide ranging from 0 to 2 mole % and (iii) a receiving layer containing physical development nuclei in water permeable relationship with said photosensitive layer, characterized in that the ratio by weight of gelatin to silver halide (expressed as an equivalent amount of $AgNO_3$) in said photosensitive layer is at least 1.35.

According to the present invention there is further provided a method for making a lithographic printing plate comprising the steps of image-wise exposing an imaging element as defined above and subsequently developing a thus obtained imaging element by an alkaline processing liquid in the presence of developing agent(s) and silver halide solvent(s).

DETAILED DESCRIPTION OF THE PRESENT INVENTION

By making use of an imaging element as described above wherein the ratio by weight of gelatin to silver halide (expressed as an equivalent amount of $AgNO_3$) in the photosensitive layer is at least 1.35, the number and density of pressure marks in said imaging material are substantially reduced. Also the printing endurance of a printing plate obtained by exposing and developing in a DTR-process said imaging element is markedly improved. Preferably the ratio by weight of gelatin to silver halide (expressed as equivalent amount of $AgNO_3$) in the photosensitive layer is at least 1.4, more preferably at least 1.6.

The imaging element in connection with the present invention essentially comprises on one side of a support a photosensitive layer comprising the above described silver halide emulsion and an image receiving layer containing physical development nuclei in water permeable relationship with said emulsion layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly (ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a layer improving the adhesion of the gelatin containing layers.

A particularly suitable adhesion improving layer, comprises a copolymer containing water-soluble monomers and water-insoluble monomers in a molar ratio between 1:99 and 20:80. Preferably the water soluble monomer is a monomer having one or more carboxylic acid groups. An example of an especially preferred copolymer for use in said adhesion improving layer is a polymer containing 1% to 10% by weight, more preferably 1% to 5% by weight of itaconic acid. Suitable polymers containing itaconic acid are e.g. copolymers of itaconic acid and vinylidene chloride, copolymers of itaconic acid, vinylidene chloride and vinylacetate, copolymers of itaconic acid, vinylidene chloride and methyl (meth)acrylate, copolymers of itaconic acid and vinyl chloride, copolymers of itaconic acid, vinyl chloride, vinylidene chloride and methyl(meth)acrylate etc. A particular suitable copolymer of itaconic acid, vinylidene chloride and optionally methyl(meth)acrylate is one wherein the amount of itaconic acid is between 1% and 5%, the amount of vinylidene chloride is between 70% and 95% and the amount of methyl(meth)acrylate is between 0% and 15%. The adhesion improving layer is preferably free of gelatin.

On top of this adhesion improving layer there may be provided a further intermediate layer containing microparticles having an average diameter of less than 50 nm preferably colloidal silica and gelatin preferably in a weight ratio of 1:2 and 2:1.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

The silver halide emulsion for use in connection with the present invention is a silver chlorobromide emulsions that contain silver bromide in the range from 0.1 mole % to 40 mole % and that may contain upto 2 mole % of silver iodide. Preferably, the amount of silver bromide is between 1 mole % and 30 mole %. An emulsion comprising more than 5 mole % of silver bromide preferably belongs to the core/shell type well known to those skilled in the art in the sense that substantially all the bromide is concentrated in the core. This core contains preferably 10 to 40 % of the total silver halide precipitated, while the shell consist preferably of 60 to 90% of the total silver precipitated. A particularly preferred silver halide emulsion of this type is described in U.S. Pat. No. 5,059,508.

The average size of the silver halide grains may range from 0.10 to 0.70 μm, preferably from 0.25 to 0.45 μm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$. This results in the building in in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can ba chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions of the DTR-element can be spectrally sensitized according to the spectral emission of the exposure source for which the DTR-element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. Particularly preferred supersensitizers for use in combination with infra-red sensitizing dyes are compounds selected from the class of 2,2' disulfonic acid, 4,4' di-(1,3,5-triazin-2-ylamino) stilbenes as described in U.S. Pat. No. 3,695,888 and EP-A 609,571. The spectral sensitizers can be added to the photographic emulsions in the form of an aqueous solution, a solution in an organic solvent or in the form of a dispersion.

The silver halide emulsions may contain the usual stabilizers. Suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat No. 4,092,168, U.S. Pat. No. 4,311,787 and DE-P 2,453,217.

More details about the composition, preparation and coating of silver halide emulsions can be found in e.g. Product Licensing Index, Vol. 92, December 1971, publication 9232, p. 107–109.

The layer containing physical development nuclei can be free of hydrophilic binder but preferably comprises amounts upto 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Between the support and the silver halide emulsion layer there is provided a base layer that contains a binder in an amount between 1 and 3 $g/m^2$, preferably between 1 and 2.3 $g/m^2$, more preferably between 1 and 1.7 $g/m^2$. Preferably, said base layer contains an anti-halation substance such as e.g. light-absorbing dyes absorbing the light used for imagewise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have an average diameter of 2–10 μm and more preferably between 2 μm and 5 μm. The matting agents are generally used in a total amount in the imaging element of 0.1 $g/m^2$ to 2.5 $g/m^2$. At least part of these matting agents and/or light reflection pigments may also be present in the silver halide emulsion layer and/or in the cover layer. As a further alternative the light reflecting pigments may be present in a separate layer provided between the base layer and the photosensitive silver halide emulsion layer. Like the emulsion layer the base layer is coated preferably at a pH value near the isoelectric point of the gelatin in the base layer.

According to a particularly preferred embodiment in connection with the present invention the base layer also contains a filler which may partially replace the binder of the base layer. Suitable fillers for use in connection with the present invention are inorganic particles, e.g. silica, titane dioxide, having an average particle diameter of 3 nm to 100 nm. A particularly preferred filler is colloidal silica having an average particle diameter of 4 to 20 nm. It has been found that the addition of a filler to the base layer improves the hydrophilic character of the non-image areas and consequently enhances the difference in ink acceptance between the image and non-image areas. The filler particles can be used in an amount of 0.1 to 1.5$g/m^2$ and more preferably in an amount of 0.2 to 0.9 $g/m^2$. Mixtures of different type of filler particles may also be used.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack and can be transparent or opaque.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, triacrylformal and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Examples of suitable surface-active agents are described in e.g. EP 545452. Preferably compounds containing perfluorinated alkyl groups are used.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth) acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth) acrylates, sulphoalkyl (meth)acrylates, and styrene sulphonic acids.

The above described DTR mono-sheet imaging element in connection with the present invention is image-wise exposed to a high intensity short time scanning exposure e.g. a laser or LED containing device. Subsequently the imaged element is developed with an alkaline processing liquid in the presence of developing agent(s) and silver halide solvent (s).

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used. Said developing agents may be contained in an alkaline processing liquid but are preferably contained in one or more layers of the photographic element. In the latter case the alkaline processing liquid merely serves as an alkaline activating liquid.

The pH of said alkaline liquid is preferably between 9 and 14, more preferably between 10 and 14 and may be established by an organic and/or inorganic alkali agent. Examples of suitable alkali agents are e.g. sodium hydroxide, carbonates, phosphates, alkanolamines or mixtures thereof.

The alkaline processing liquid preferably also contains a preserving agent having antioxidation activity, e.g. sulphite ions. Further may be present a thickening agent, fog inhibiting agents e.g. a benzotriazole which is known to improve the printing endurance, calcium-sequestering compounds, anti-sludge agents, development accelerators and hardeners including latent hardeners.

Suitable silver complexing agents also called silver halide solvents for use in accordance with the present invention are e.g. thiosulphate or thiocyanate in an amount ranging from 5 g to 50 g per liter. Other interesting silver halide complexing agents are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers, preferably di- or poly-thioethers as disclosed in e.g. U.S. Pat. No. 4,960,683 and EP-A 554,585.

Still further suitable silver halide solvents are meso-ionic compounds, preferably 1,2,4-triazolium-3-thiolates as disclosed in e.g. EP-A 554,585.

Combinations of different silver halide solvents can be used and it is also possible to incorporate at least one silver halide solvent into a suitable layer of the imaging element and to add at least one other silver halide solvent to the developing or activating solution. Preferably they are comprised in the alkaline processing liquid.

The development step is preferably followed by a neutralization of the surface of the imaged element by guiding the element through a neutralization liquid having a pH between 4 and 8. The pH of a fresh neutralizing solution lies preferably between 5 and 7. The neutralization liquid preferably contains a buffer e.g. a phosphate buffer, a citrate buffer, an amine or a mixture thereof. The neutralization solution can further contain bactericides, e.g. phenol, thymol or 5-bromo-5-nitro-1,3-dioxan as described in EP-150,517, wetting agents e.g. saponins or pluronics etc. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

To improve the differentiation between the hydrophobic silver image and the hydrophilic background the alkaline processing liquid and/or neutralization liquid preferably contain one or more hydrophobizing agents. Generally these compounds contain a mercapto group or thiolate group and one or more hydrophobic substituents, e.g. those described in U.S. Pat. No. 3,776,728 and U.S. Pat. No. 4,563,410. Preferred hydrophobizing agents are 2-mercapto-1,3,4-thiadiazoles as described in DE-A 1,228,927 and in U.S. Pat. No. 4,563,410, 2-mercapto-5-alkyl-1,3,4-oxadiazoles, 3-mercapto-5-alkyl-1,2,4-triazoles and long chain (at least 5 carbon atoms) alkyl substituted mercaptotetrazoles. Particularly preferred compounds are 2-mercapto-5-n-heptyl-1,3,4-oxadiazole and 3-mercapto-4-acetamido-5-n-heptylalkyl-1,2,4-triazoles A lithographic printing plate is thus obtained.

The invention will now be illustrated by the following examples without however the intention to limit the invention thereto. All parts are by weight unless otherwise specified.

EXAMPLE 1

Preparation of a silver halide emulsion:

A gelatino silver halide emulsion was prepared by double jet precipitation by slowly mixing with stirring an aqueous solution of AgNO$_3$ having a concentration of 2 mole/l, and an aqueous solution having a concentration of 1.7 mole/l of NaCl, 0.48 mole/l of KBr and 0.001 mole/l of KI. Before the precipitation $5.10^{-4}$ mole/l of sodium hexachlororhodaat was added to the silver nitrate solution. In a second part of the precipitation an aqueous solution of AgNO$_3$ having a concentration of 1 mole/l was slowly mixed with an aqueous solution of NaCl at a concentration of 1.3 mole/l, The temperature during the silver halide formation was 55° C.

A core-shell emulsion was obtained containing 22 mole % of silver bromide and 0.5 mole % of silver iodide.

The obtained core-shell emulsion was cooled, flocculated and washed. Gelatin was added in an amount sufficient to reach a ratio of ⅔ by weight of gelatin to silver halide, expressed as equivalent amount of silver nitrate. Subsequently a chemical ripening was carried out in a conventional way known to those skilled in the art using thiosulphate and gold salts. Finally the emulsion was sensitized for the red spectral region (600–700nm) and gelatin added to reach a ratio by weight of gelatin to silver halide (expressed as equivalent AgNO$_3$) of 0.9 (emulsion A), 1 (emulsion B), 1.7 (emulsion C), or 1.8 (emulsion D).

Preparation of the imaging elements:

A polyethylene terephthalate film support provided with a adhesion improving layer was coated with an intermediate layer containing gelatin in an amount of 0.4g/m$^2$ and colloidal silica having an average particle diameter of 7 nm in an amount of 0.4g/m$^2$. The adhesion improving layer contained a copolymer of itaconic acid (2%), vinylidene chloride (88%) and methylmethacrylate (10%) at a total coverage of about 0.2g/m$^2$.

Photographic DTR mono-sheet materials were prepared as follows. One side of the above described polyethylenenterephthalate film support was coated with two layers by a double layer coating technique the layer nearer to the support being the base layer or antihalation layer and the other being the emulsion layer. The emulsion was coated at an amount of silver halide corresponding to 1.5 g AgNO$_3$/m$^2$. The emulsion layer contained 0.1 g/m$^2$ of 1-phenyl-3-pyrazolidinone.

The base layer or antihalation layer contained carbon black and gelatin at 2.7 g/m$^2$ (imaging element 1) or 1.5 g/m$^2$ (imaging elements 2 and 3). Imaging elements 1 and 2 were coated with emulsion A while imaging element 3 was coated with emulsion C.

After drying these layers were subjected to a temperature of 40° C. for 5 days and then overcoated with a layer containing PdS nuclei. The layer further contained hydroquinone at 0.4 g/m$^2$ and formaldehyde at 100 mg/m$^2$.

The following processing solutions were prepared:

Activator solution

| | |
|---|---|
| sodium hydroxide (g) | 30 |
| sodium sulphite anh. (g) | 33 |
| potassium thiocyanate (g) | 20 |
| 3-mercapto-4-acetamido-5-n.heptyl-1,2,4-triazole (g) | 0.15 |
| water to make | 1000 ml |

Neutralization solution

| | |
|---|---|
| citric acid | 10 g |
| sodium citrate | 35 g |
| cysteine | 1 g |
| sodium-sulphite anh. | 5 g |
| phenol | 50 mg |
| water to make | 100 ml |

Dampening solution

| | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

An unexposed sample of each of the DTR materials as described above was under safe-light conditions brought in contact with a small wheel. The wheel made a circular movement under a constant pressure over the plate. After 10 revolutions of the wheel, the DTR material was treated with the above described activator solution for 15 seconds at 30° C. and thereupon treated with the described neutralization solution at 25° C. and finally dried. The minimum reflection density of an untreated area (control) and of the treated area of each treated sample were measured. The results are given in table 1. It is clear that the pressure marks obtained on imaging materials 1 and 2 (comparison material) are clearly more outspoken than the pressure marks obtained on sample 3 (sample according to the invention)

TABLE 1

| | | | D$_{min}$ reflection[b] | | |
|---|---|---|---|---|---|
| Number | Gesi[a] | Base layer (μm) | A | B | Δ D$_{min}$ |
| 1 | 0.9 | 2.7 | 0.54 | 0.78 | 0.24 |
| 2 | 0.9 | 1.5 | 0.59 | 0.80 | 0.21 |
| 3 | 1.7 | 1.5 | 0.51 | 0.66 | 0.15 |

Remarks
[a]Gesi: the ratio by weight of the gelatin to the silver halide (expressed as AgNO$_3$) in the emulsion layer
[b]D$_{min}$ reflection: The measured minimum reflection density for
A) an untreated area of the material
B) a treated area of the material

EXAMPLE 2

Imaging element 4 was prepared in an identical way as imaging element 1 with the exeption that the base layer contained 2.7g/m$^2$ gelatin and was overcoated with emulsion B. Imaging element 5 was prepared in an identical way as imaging element 1 with the exeption that the base layer contained 1.4 g/m$^2$ gelatin and was overcoated with emulsion D.

An unexposed sample of each of these two DTR-materials as described above was under safe-light conditions brought in contact with a small wheel. The wheel made a circular movement under a constant pressure over the plate. After 10 revolutions of the wheel, the DTR-material was image-wise exposed in the HeNe laser containing image-setter, subsequently treated with the above described activator solution for 15 seconds at 30° C. and thereupon treated with the described neutralization solution at 25° C. and finally dried. The minimum reflection density of an untreated area (control) and of the treated area of each treated sample were measured. The results are given in table 2. It is clear that the pressure marks obtained on imaging material 4 (comparison material) are clearly more outspoken than the pressure marks obtained on sample 5 (sample according to the invention).

The two printing plates thus prepared were mounted on the same offset printing machine (HEIDELBERG GTO 46) and were used for printing under identical conditions. During the printing run the described dampening solution was used at a 5% concentration in an aqueous solution containing 10% isopropanol and K+E 125, marketed by Kast and Ehinger, A. G., Germany as ink. A compressible rubber blanket was used.

The printing plates were evaluated for wear in the pressure treated areas. The results are given in table 2 (the higher the number, the more wear). It is clear that the wear in the treated areas of the printing plate obtained from imaging element 4 (comparison element) is greater than the wear in the treated areas of the printing plate obtained from imaging element 5 (element according to the invention).

TABLE 2

| Number | Gesi[a] | Base layer (μm) | $D_{min}$ reflection[b] A | $D_{min}$ reflection[b] B | $\Delta D_{min}$ | Wear[c] |
|---|---|---|---|---|---|---|
| 4 | 1 | 2.7 | 0.58 | 0.81 | 0.23 | 8 |
| 5 | 1.8 | 1.4 | 0.60 | 0.76 | 0.16 | 6 |

Remarks
[a], [b] see table 1
[c] wear: expressed as screen wear of a 20% point between the 50th print and the 5000th print

EXAMPLE 3

Preparation of the silver halide emulsion coating solutions.

A silver chlorobromide emulsion composed of 98 mole % of chloride, 1.7 mole % of bromide and 0.3 mole % of iodide was prepared by the double jet precipitation method. The average silver halide grain size was 0.4 μm (diameter of a sphere with equivalent volume) and contained Rhodium ions as internal dopant. The emulsion was orthochromatically sensitized and stabilized by 1-phenyl-5-mercapto-tetrazole. Finally gelatin was added to the emulsion to reach a ratio by weight of gelatin to silver halide (expressed as equivalent AgNO$_3$) of 0.9 (emulsion E) or 1.7 (emulsion F).

Preparation of the imaging elements

Imaging element 6 was prepared in an identical way as imaging element 1 with the exeption that the base layer contained 2.7g/m$^2$ gelatin and was overcoated with emulsion E. Imaging element 7 was prepared in an identical way as imaging element 1 with the exeption that the base layer contained 1.5g/m$^2$ gelatin and was overcoated with emulsion F.

An unexposed sample of each of these two DTR-materials as described above was under safe-light conditions brought in contact with a small wheel. The wheel made a circular movement under a constant pressure over the plate. After 10 revolutions of the wheel, the DTR-material was image-wise exposed trough a screen in a camera, subsequently treated with the above described activator solution for 15 seconds at 30° C. and thereupon treated with the described neutralization solution at 25° C. and finally dried. The minimum reflection density of an untreated area (control) and of the treated area of each treated sample were measured. The results are given in table 3. It is clear that the pressure marks obtained on imaging material 6 (comparison material) are clearly more outspoken than the pressure marks obtained on sample 7 (sample according to the invention).

The two printing plates thus prepared were mounted on the same offset printing machine (HEIDELBERG GTO 46) and were used for printing under identical conditions. During the printing run the described dampening solution was used at a 5% concentration in an aqueous solution containing 10% isopropanol and K+E 125, marketed by Kast and Ehinger, A. G., Germany as ink. A compressible rubber blanket was used.

The printing plates were evaluated for wear in the pressure treated areas. The results are given in table 3 (the higher the number, the more wear). It is clear that the wear in the treated areas of the printing plate obtained from imaging element 6 (comparison element) is greater than the wear in the treated areas of the printing plate obtained from imaging element 7 (element according to the invention).

TABLE 3

| Number | Gesi[a] | Base layer (μm) | $D_{min}$ reflection[b] A | $D_{min}$ reflection[b] B | $\Delta D_{min}$ | Wear[c] |
|---|---|---|---|---|---|---|
| 6 | 0.9 | 2.7 | 0.55 | 0.79 | 0.24 | 7 |
| 7 | 1.7 | 1.5 | 0.55 | 0.69 | 0.14 | 5 |

Remarks
[a], [b], [c] see table 1

We claim:

1. An imaging element comprising on a support in the order given (i) a base layer comprising a binder in an amount between 1 and 3 g/m$^2$, (ii) a photosensitive layer comprising a spectrally sensitised silver halide emulsion, said emulsion consisting principally of silver chloride but containing bromide ranging from 0.1 mole % to 40 mole % and iodide ranging from 0 to 2 mole % and (iii) a receiving layer containing physical development nuclei in water permeable relationship with said photosensitive layer, characterized in that the ratio by weight of gelatin to silver halide (expressed as an equivalent amount of AgNO$_3$) in said photosensitive layer is at least 1.35.

2. An imaging element according to claim 1 wherein said ratio by weight of gelatin to silver halide (expressed as an equivalent amount of AgNO$_3$) in said photosensitive layer is at least 1.5.

3. An imaging element according to claim 1 wherein said base layer contains a binder in an amount between 1 and 2.3 g/m$^2$.

4. An imaging element according to claim 3 wherein said base layer contains a binder in an amount between 1 and 1.7 g/m$^2$.

5. A method for making a lithographic printing plate comprising the steps of image-wise exposing an imaging element according to claim 1 and subsequently developing a thus obtained imaging element by an alkaline processing liquid in the presence of developing agent(s) and silver halide solvent(s).

* * * * *